United States Patent [19]

Holmes

[11] Patent Number: 4,808,511
[45] Date of Patent: Feb. 28, 1989

[54] VAPOR PHASE PHOTORESIST SILYLATION PROCESS

[75] Inventor: Steven J. Holmes, Burlington, Vt.

[73] Assignee: International Business Machines Corporation, Armonk, N.Y.

[21] Appl. No.: 51,354

[22] Filed: May 19, 1987

[51] Int. Cl.⁴ .................................................. G03C 5/00
[52] U.S. Cl. .................................. 430/325; 430/323; 156/628; 156/643
[58] Field of Search ............... 430/325, 326, 330, 323; 156/628, 643

[56] References Cited

U.S. PATENT DOCUMENTS

| | | | |
|---|---|---|---|
| 4,400,509 | 8/1983 | Bruynes et al. | 544/315 |
| 4,491,628 | 1/1985 | Ito et al. | 430/176 |
| 4,518,787 | 5/1985 | Treadgold | 556/442 |
| 4,552,833 | 11/1985 | Ito et al. | 430/325 |
| 4,596,761 | 6/1986 | Brault | 430/296 |
| 4,657,845 | 4/1987 | Frechet et al. | 430/326 |

FOREIGN PATENT DOCUMENTS 2154330 9/1985 United Kingdom .

Primary Examiner—José G. Dees
Attorney, Agent, or Firm—William D. Sabo

[57] ABSTRACT

A process for improved vapor phase silylation of photoresist is disclosed. The process uses silylation materials which either produce a strong base such as dimethylamine upon reaction with a resist film or which contain an improved chemical leaving group such as acetate. The process is effective at temperatures of 135 C. and below. Preferred silylation materials are N,N-dimethylaminotrimethylsilane and trimethylsilylacetate.

3 Claims, 2 Drawing Sheets

VAPOR PHASE PHOTORESIST SILYLATION PROCESS

BACKGROUND OF THE INVENTION

This invention relates to a vapor phase photoresist silylation process. More particularly, it relates to a low temperature silylation process for use with photoresists having low thermal stability.

The manufacture of microelectronic devices such as semiconductor integrated circuit devices usually involves the patterned etching of resist-patterned layers. Formerly such etching was done with wet chemicals. With the increasing demand for tighter tolerances and higher yields, wet etching has been increasingly replaced by dry etching techniques. Many of these techniques involve the use of oxygen gas as one of the etchant species. The oxygen causes removal or "ashing" of the patterned resist layer and results in unacceptable film thickness loss.

Resists were developed which incorporated silicon-containing groups, typically trimethylsilyl groups. These resists were resistant to oxygen plasma because a silicon oxide barrier formed as etching progressed, but used standard wet development techniques. Incorporation of silicon into the bulk resist was followed by selective incorporation of silicon into either the exposed or unexposed regions of the coated resist. This allowed image development by oxygen plasma and eliminated another wet process step. However, the silylation process itself was a solution process which typically used hexamethylcyclotrisilazane (HMCTS). This produced swelling of the resist images.

Vapor phase silylation with HMDS has been tried and found to be less effective than solution silylation because the high temperatures required cause reflow of many novolac-based resists and cause thermal decomposition of resists such as poly(t-butoxycarbonyloxystyrene) (t-BOC). The high temperatures required are a result of the low reactivity of HMDS.

U.S. Pat. 4,552,833 discloses vapor phase silylation with HMDS of poly(t-butoxycarbonyloxystyrene) (t-BOC) at 85 C for one hour under vacuum. Subsequent studies have shown that images obtained when silylation at such low temperatures is used possess defects which appear to be due to incomplete silylation. Although HMDS can effectively silylate t-BOC at higher temperatures, thermal instability of the resist is a limiting factor. The practical limit for thermal processing of t-BOC is 125-130 C. Above these temperatures, the masking functionality is thermally cleaved from the resist polymer. This causes unselective incorporation of organometallic reagent in both the exposed and unexposed resist regions. As a result, substantial amounts of residuals are obtained after RIE processing. The other reagents disclosed in U.S. Pat. No. 4,552,833 are highly toxic and/or highly corrosive and unsuitable for use in a manufacturing environment.

Although other silicon-containing reagents are theoretically capable of incorporating silicon into a resist film, in a manufacturing environment there are several criteria that must be satisfied. For resists such as t-BOC which have a masking functionality, the silylation temperature must be below the thermal decomposition point of the masking functionality. The silylation temperature must also be below the reflow limit of the resist. Silylation must occur at a rapid rate, so that acceptable throughput levels are achieved, and must go to a high degree of completion, so that a sufficient degree of hardening to RIE conditions can be achieved. Finally, the silylation material should be non-toxic and non-corrosive, and should not introduce metal impurities into the electronic device which can act as dopant materials.

SUMMARY OF THE INVENTION

Accordingly, it is an object of the present invention to improve the process used for vapor phase silylation of photoresist.

It is a further object of the invention to allow vapor phase silylation of photoresist at a low temperature.

It is another object of the invention to effectively silylate poly(t-butoxycarbonyloxystyrene) or novolac-based resists in the vapor phase.

It is a further object of the invention to silylate resists in the vapor phase with materials that are relatively non-toxic, non-corrosive, and which will not introduce metal impurities into the electronic devices.

These and other objects of the invention are achieved by selecting silylation materials which either produce a strong base such as dimethylamine upon reaction with a resist film or which contain an improved chemical leaving group such as acetate. Preferred silylation materials are N,N-dimethylaminotrimethylsilane and trimethylsilylacetate. The silylation process is effective at temperatures of 135 C. and below.

DESCRIPTION OF THE PREFERRED EMBODIMENTS

Figure 1:
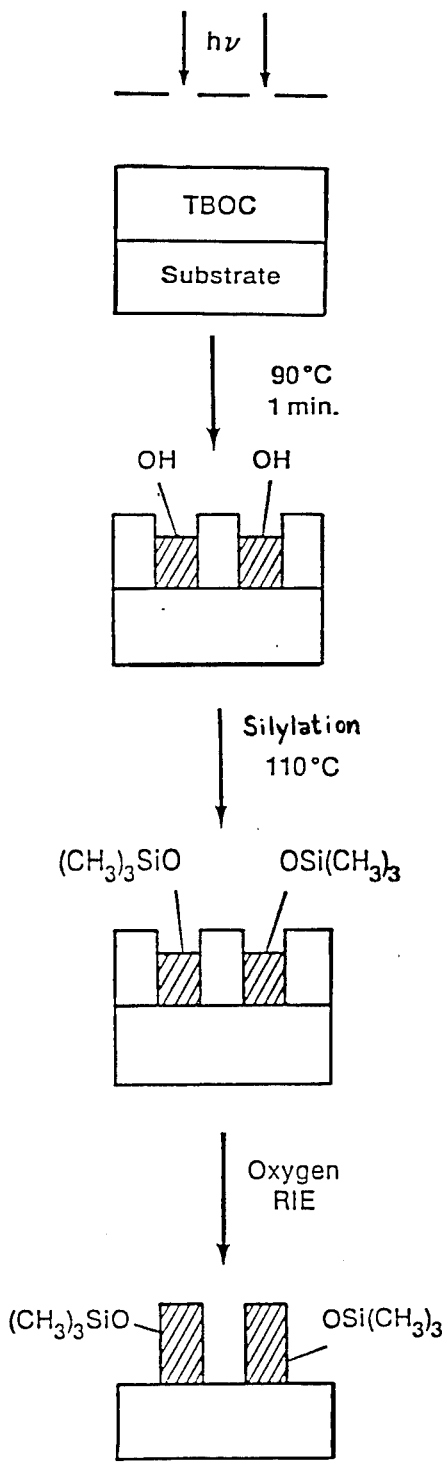
FIG. 1 is a schematic of the processing sequence for dry imaging of t-BOC photoresist.
Figure 2:
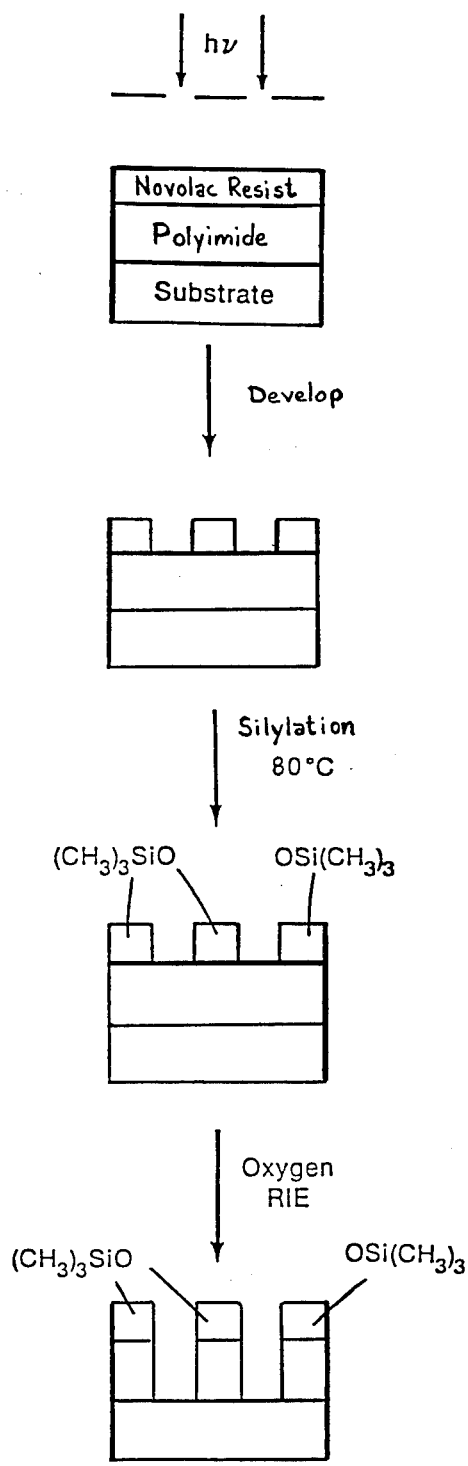
FIG. 2 is a schematic of the processing sequence for dry imaging of novolac-based photoresist.

Silylation strategies involve chemical modification of phenolic photoresists or photoresists having phenolic intermediates by the incorporation of silicon. Typically, the hydrogen of the phenol hydroxyl group is replaced by the trimethylsilyl group. For poly(t-butoxycarbonyloxystyrene) (t-BOC) the sequence of steps is shown in FIG. 1. Upon exposure and bake, the masking functionality of the resin backbone is removed in the exposed areas. Silylation occurs only in those areas where the masking functionality has been removed. Thus, the latent image is hardened by silylation, and developed by RIE, as described in U.S. Pat. 4,552,833, incorporated herein by reference. The approach for novolac-based resists differs in that the resist image must be developed prior to silylation (FIG. 2). This is due to the absence of a masking functionality on the unexposed novolac resin. (Silylation of a novolac-based resist prior to development would result in incorporation of silicon in both exposed and unexposed areas.) After development and silylation, the image can be transferred through an underlayer by RIE. Usually this underlayer is an organic material (e.g. polyimide) which serves to planarize the substrate and eliminate reflections. Previously used silylation methods for novolac-based resists have consisted of "wet" processes in which the wafers are silylated by immersion in a bath.

The present invention relates to a low temperature vapor phase process for incorporating silicon into a resist film using silylation agents which either produce a strong base upon reaction with the resist film or which contain an improved chemical leaving group. Specific materials having one or the other of these properties were found to be effective in the silylation of exposed t-BOC films. The preparation and processing of this photoresist is disclosed in U.S. Pat. No.4,491,628 and U.S. Pat. No. 4,552,833, both of which are incorporated herein by reference. The improved vapor phase process has also been found effective with any resist which can be silylated by conventional techniques, such as those resists having novolac resins.

Silylation materials producing a strong base upon reaction with the resist film have an accelerated rate of silylation. The presence of the strong base allows the process to occur at lower temperatures and in a shorter time. An example of such a material is N,N-dimethylaminotrimethylsilane which produces the strong base dimethylamine upon reaction with resist films. Interestingly, bis(dimethylamino)dimethylsilane, which contains two of the strong base groups, is not an effective silylation agent.

Silylation materials having an improved chemical leaving group also allow the silylation process to occur at lower temperatures and in a shorter time. An example of such a material is trimethylsilylacetate which has acetate as its improved chemical leaving group.

It has been found that at least 7% silicon by weight must be incorporated into the film before acceptable image formation can be achieved. In order to obtain 7% silicon by weight, at least 50% silylation of the phenolic resin functionality must be achieved. The reagents disclosed herein easily achieve the required level of silylation due to their high reactivity. This is important because partial silylation does not provide sufficient RIE resisitance to the image.

The silylation materials disclosed are both relatively nontoxic and noncorrosive. The N,N-dimethylaminotrimethylsilane produces amine byproducts which are nontoxic and noncorrosive. The trimethylsilylacetate produces acetic acid which is nontoxic and only mildly corrosive. In comparison, trimethylstannylchloride and trimethylsilylchloride (disclosed in U.S. Pat. No. 4,552,833) both generate hydrogen chloride as a byproduct. This is a highly corrosive acid which can cause a variety of problems including high levels of particulates due to degradation of metal materials in manufacturing equipment. Commonly used materials such as stainless steel and aluminum cannot be used in the presence of strong acids. Therefore the use of these chemicals would require that special alloys such as hastelloy be incorporated into the manufacturing equipment. This substantially increases the cost of tooling because such materials are more expensive and more difficult to machine. Vacuum pumps are damaged by strong acids and the useful life of this equipment is reduced. Furthermore, expensive pump oil must be used with corrosive materials. Finally, the corrosive byproducts must be handled and disposed of in a safe manner. In addition to problems with corrosivity, trimethylstannylchloride is highly toxic: the minimum dose required to induce a toxic condition is 9 mg/kg of body weight.

The invention will be more fully illustrated by the following examples which are non-limiting.

EXAMPLE 1

Silylation of blanket t-BOC resist films 125 mm double polished silicon wafers are coated with 0.5 to 2.5 microns of t-BOC resist and baked for 1-6 minutes at 70-140 C. After a blanket exposure of 1.3-25 mJ/cm$^2$ on a Perkin Elmer PMA-500 with a UV2 filter, the wafers are baked at 65-95 C. for 40-350 seconds. The wafers were then placed in a vacuum oven heated to the specified temperature. The oven was evacuated and the wafer was allowed to equilibrate to the oven temperature for a period of 3 minutes. The silylation agent was introduced to the reaction chamber as a pure liquid with a syringe. After a 3 minute process time, the chamber was evacuated. The excess reagent and byproducts were collected in a cold trap (96K). Infrared analysis of the silylated film was used to determine the amount of silicon incorporated into the resist. The ratio of the aromatic absorbance at 1500 cm$^{-1}$ to the trimethylsilyl absorbance at 1250 cm$^{-1}$ was used to quantify the degree of silylation of the phenolic functionality in the resin. The results are summarized in Table 1.

TABLE 1

| VAPOR PHASE SILYLATION OF DUV RESIST | | | |
|---|---|---|---|
| Silylation Reagent | Pressure Torr | Temperature C. | % Silylation |
| (N,N—dimethylamino)-trimethylsilane | 100 | 135 | 100 |
|  | 100 | 125 | 100 |
|  | 100 | 107 | 54 |
|  | 300 | 135 | 100 |
| Trimethylsilyl-acetate | 100 | 135 | 0 |
|  | 200 | 135 | 82 |
|  | 300 | 135 | 95 |
| Bis(dimethylamino)-dimethylsilane | 100 | 135 | 12 |
|  | 150 | 135 | 9 |
|  | 250 | 135 | 12 |
| Hexamethyldisilazane | 80 | 135 | 0 |
|  | 140 | 135 | 0 |
|  | 250 | 135 | 0 |

EXAMPLE 2

Silylation of imaged t-BOC resist films 125 mm double polished silicon wafers are coated with a 0.5-2.5 micron thick film of t-BOC resist and baked for 1-6 minutes at 70-140 C. The wafers are exposed at 1.3-25 mJ/cm$^2$ on a Perkin Elmer PMA-500 with a UV2 filter. A 1.0 micron dimensioned mask is used. The wafers are baked at 65-95 C. for 40-350 seconds. The image silylation was performed as in Example 1, using 92 torr of N,N-dimethylaminotrimethylsilane at 124 C. for 3 minutes. Reagents, temperatures and pressures were as shown in Table 1. Image formation was accomplished by subjecting the wafer with exposed silylated regions to an oxygen RIE in an Applied Materials 8100 tool. Etch conditions were 15 sccm oxygen, 0.8 torr, −635 V DC bias, 45 C., 35 minutes. Scanning electron micrographs of images formed with HMDS show that image integrity is destroyed during RIE because of low silylation levels. Central portions of images contain moderate to severe depressions as a result of insufficient silylation in the central portion of the exposed resist. In contrast, scanning electron micrographs of images formed with N,N-dimethylaminotrimethylsilane and trimethylsilylacetate show negligible erosion due to high levels of silylation.

EXAMPLE 3

Silylation of imaged novolac resist films 125 mm double polished silicon wafers were coated with a 1.1 micron thick film of a resist. The sensitizer of the resist was prepared according to U.S. Pat. No. 4,397,937, incorporated herein by reference. The resin can be any of the commonly used phenolic resins such as phenolformaldehyde or cresol-formaldehyde. The wafers were baked at 90 C for 10 minutes. After exposure at 140 mJ/cm² on a Perkin Elmer 500 with a UV4 filter, the images were developed in 0.18 N KOH solution for 9 minutes. The imaged films were rinsed, dried and treated with silylation agent as in Example 1. The results are shown in Table 2. Optical inspection indicated that image integrity was maintained for silylation temperatures below 85 C.

TABLE 2

VAPOR PHASE SILYLATION OF NOVOLAC RESIN

| TEMPERATURE (C.) | TIME (Min) | PRESSURE (Torr) | IMAGE REFLOW | % SILYLATION |
|---|---|---|---|---|
| 65 | 15 | 78 | No | 0 |
| 75 | 15 | 62 | No | 62 |
| 85 | 15 | 68 | Yes | 68 |
| 90 | 15 | 166 | Yes | 100 |
| 105 | 15 | 170 | Yes | 96 |

SILYLATION REAGENT:
N,N-DIMETHYLAMINOTRIMETHYLSILANE

While the invention has been described with respect to specific embodiments, it will be understood by those skilled in the art that various changes in detail may be made therein without departing from the spirit, scope, and teaching of the invention. For example, other silylating agents which produce a strong base or which have improved chemical leaving groups could be used. The process can be employed with any resist capable of silylation. Accordingly, the invention herein disclosed is to be limited only as specified in the following claims.

I claim:

1. A vapor phase photoresist silylation process comprising the steps of:
    coating a substrate with a photoresist film that contains a masked reactive functionality;
    imagewise exposing said film to radiation under conditions that cause unmasking of the reactive functionality in the exposed regions of the film;
    treating said exposed film with a silylating agent having the formula $SiR_4$ wherein one of said R groups is an acetate group;
    and developing the resulting image by RIE to obtain a negative tone relief image.

2. A vapor phase photoresist silylation process comprising the steps of:
    coating a substrate with a photoresist film that contains a masked reactive functionality;
    imagewise exposing said film to radiation under conditions that cause unmasking of the reactive functionality in the exposed regions of the film;
    treating said exposed film with a silylating agent, wherein said silylating agent is trimethylsilylacetate; and
    developing the resulting image by RIE to obtain a negative tone relief image.

3. The process according to claim 2 wherein said photoresist is poly(t-butoxycarbonyloxystyrene).

* * * * *